United States Patent [19]

Moutou et al.

[11] 4,307,131

[45] Dec. 22, 1981

[54] METHOD OF MANUFACTURING METAL-SEMICONDUCTOR CONTACTS EXHIBITING HIGH INJECTED CURRENT DENSITY

[75] Inventors: Paul C. Moutou; Jacques Montel, both of Paris, France

[73] Assignee: Thomson-CSF, Paris, France

[21] Appl. No.: 83,230

[22] Filed: Oct. 10, 1979

Related U.S. Application Data

[63] Continuation of Ser. No. 763,012, Jan. 27, 1977, abandoned.

[51] Int. Cl.³ .......................................... H01L 21/283
[52] U.S. Cl. ...................................... 427/84; 156/643; 156/662; 219/121 LM; 250/492.3; 427/88; 427/93; 430/314
[58] Field of Search ................... 219/121 LM; 427/84, 427/88, 93; 156/643, 662; 357/68; 430/314; 250/492 B

[56] References Cited

U.S. PATENT DOCUMENTS

| | | | |
|---|---|---|---|
| 3,364,087 | 1/1968 | Solomon et al. | 118/641 |
| 3,636,417 | 1/1972 | Kimura | 357/15 |
| 3,698,941 | 10/1972 | De Nobel et al. | 427/57 |
| 4,056,642 | 11/1977 | Saxena et al. | 427/84 |
| 4,098,917 | 7/1978 | Bullock et al. | 427/36 |
| 4,107,835 | 8/1978 | Bindell et al. | 427/84 |

FOREIGN PATENT DOCUMENTS

1234544 6/1971 United Kingdom .

Primary Examiner—John D. Smith
Attorney, Agent, or Firm—Oblon, Fisher, Spivak, McClelland & Maier

[57] ABSTRACT

A method for virtually eliminating contact resistances in particular at very high frequency, for instance in the case of source and drain contacts of a field effect transistor. The method consists in creating a matrix of depressions or "dishes", for example 1 to 6 microns in diameter, separated by intervals of some few microns. In a first step, windows are opened in an insulating layer by an etching operation. In a second step, by ion machining, angular profiles are carved in the bottom of the dishes for promoting tunnel effect. In a last step a metal layer is deposited and enshrouds the matrix.

10 Claims, 8 Drawing Figures

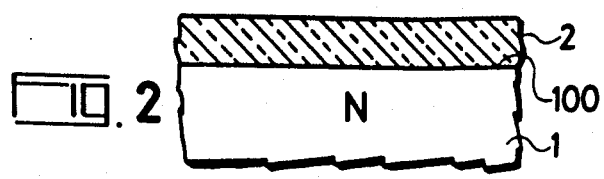
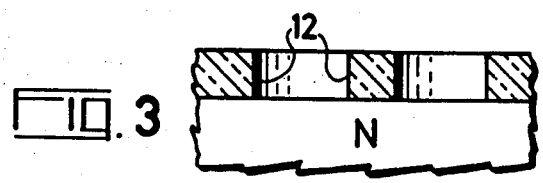
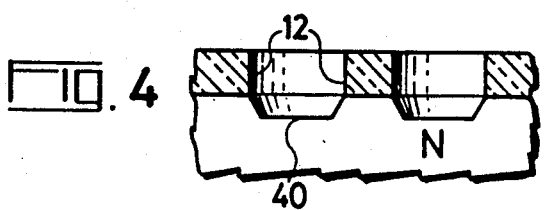
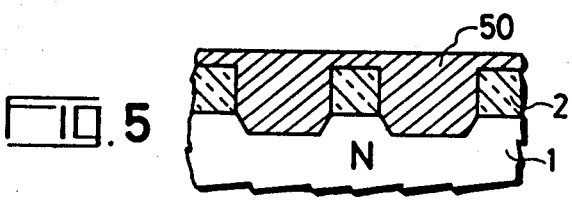
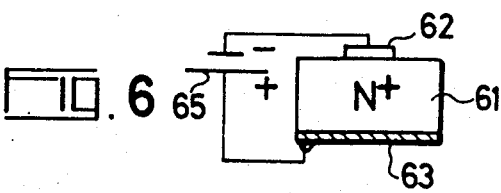

METHOD OF MANUFACTURING METAL-SEMICONDUCTOR CONTACTS EXHIBITING HIGH INJECTED CURRENT DENSITY

This is a continuation of application Ser. No. 763,012, filed Jan. 27, 1977, now abandoned.

The present invention relates to a method of manufacturing "metal-semiconductor" contacts with a high injection density, and also to the devices obtained by said method. The invention relates in particular to so-called "ohmic" contacts formed in semiconductor components for purposes of the input and output of electric current between a lead and a given region of the semiconductor material.

In the following, the term "contact area" will be assumed to refer to that zone of the semiconductor which is designed for the connection of a lead, for example the area occupied by a metallised coating on the semiconductor material. The term "injected current density" will be used to describe the ratio between the total current flowing through the lead and that flowing through the said contact area. In the case of a contact which is formed by microscopic studs, as is that in accordance with the present invention, the studs being distributed over the whole area of the "contact", the injected current density is obtained by dividing the current resulting from the addition of the currents injected through the studs, by the above defined contact area.

In a conventional way, a "metal-semiconductor" contact is formed by depositing a small quantity of metal or metal alloy on the surface of the semiconductor material whereafter a suitable heat treatment is carried out during which the metal or metal alloy melts and bonds to the semiconductor material. On cooling, a recrystallised layer of semiconductor material highly doped by the metal or alloy, forms. The injected current density, for a given electric field, will be the higher the more highly the said layer is doped; the equivalent electrical resistance will be correspondingly lower. It is clear that using this technology the aim is towards achieving a uniform alloy layer over the whole contact area; the alloy should wet the semiconductor as effectively as possible.

The aim of the present invention is towards obtaining an injected current density which is higher than that achievable using the conventional technology. The increase in the injected current density is of industrial importance in particular in the case of very high frequency applications, for the following two reasons:

the need to eliminate contact resistances as far as possible, this being achieved by increasing the injected current across a given area;

the need to limit the area of the contacts due to the very tiny dimensions of the components normally used in very high frequency applications.

In accordance with the invention, there is provided a method of manufacturing "metal-semiconductor" contacts with a high injection density, comprising at least the two following operations:

(A) Forming of a matrix of microscopic depressions at the surface of the semiconductor, the depressions being separated by a layer which prevents the flow of current;

(B) Depositing of conductive material in said depressions, the deposition being continued until a single conductive layer covering the matrix of depressions is formed.

The invention will be better understood and other of its features rendered apparent, from a consideration of the ensuing description and the accompanying drawings in which:

FIG. 1, at a, illustrates a plan view and at b a sectional view in the plane of a the line AA shown in FIG. 1a, of a fragment of semiconductor material which has undergone operation (A) of the method in accordance with the invention;

FIGS. 2 to 5 illustrate different steps in an embodiment of the method in accordance with the invention;

FIG. 6 illustrates an experimental assembly;

Figure 1:
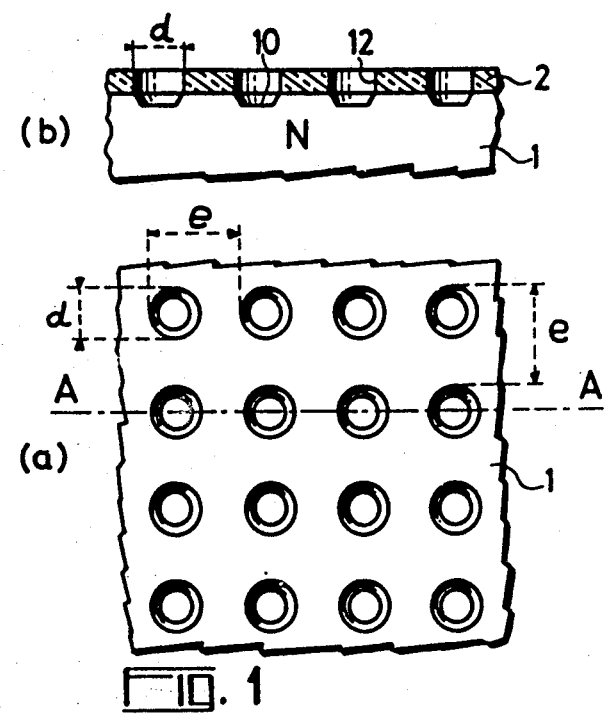

Part of the matrix of depressions or "dishes" formed during the operation (A) of the method in accordance with the invention, can be seen at a in FIG. 1. The section b illustrates the profile of the depressions 10 which are formed in a semiconductor material 1, for example N-doped gallium arsenide, covered with an insulating layer 2 of for example silica containing windows 12 opposite the depressions 10. This profile has for example the form of a trapezium whose smaller base is at the level of the base of the depression and whose height represents a fraction of the larger base, namely is equal to a third or a fifth thereof. This profile could equally well be circular or elliptical.

Viewed in plan, the depressions for example have a circular shape and all have the same diameter d of the order of 0.5 to 10 microns.

They are arranged for example in rows and columns of the same pitch e (1.5 to 30 microns for example) over the whole surface assigned to the matrix. If we call r the ratio of the sum of the individual areas of the depressions (considered in projection onto the surface of the semiconductor) to the total area of the matrix, then this ratio can readily be calculated as a function of the diameter d and the pitch e, giving us the following approximate relationship:

$$r = (3d^2/4e^2)$$

By way of example:

for d=6 microns and e=10 microns, we have r=0.27 for d=3 microns and e=10 microns, we have: r=0.07 approx.

for d=2 microns and e=5 microns, we have: r=0.12 for d=1 micron and e=3 microns, we have: r=0.08 approx.

More generally, the following are the possible ranges of variation:

$$0.5\mu \leq d \leq 10\mu$$

$$1.5\mu \leq e \leq 30\mu$$

$$0.05 \leq r \leq 0.5$$

The operations (A) and (B) of the method in accordance with the invention, comprise various steps in each case.

1—Operation A

First step: upon the surface 100 (FIG. 2) which has previously been given a flat finish by careful grinding, of a semiconductor material such as gallium arsenide, there is deposited for example by vapour-deposition a layer 2 of silica having a thickness of the order of 0.5 to 5 microns.

Second step: the windows 12 (FIG. 3) are opened out in the layer 2 in order to bare the semiconductor material. If photoetching techniques are used, then the following subsidiary steps are used:
the surface 100 is covered with photosensitive resin;
the surface 100 is masked using a layer which produces (in positive or negative fashion as the case may be) the pattern of the windows 12;
the photosensitive resin is exposed to actinic light;
the thus exposed resin is developed;
the silica is chemically etched and thus removed from the areas unprotected by the resin.

Third step: ion machining of the gallium arsenide bared in the windows 12 is carried out. The gallium arsenide is more readily removed than the silica. In the case of a different semiconductor material, the silica layer must be thicker in order to withstand the ion machining.

In this fashion, a profile 40 in the form of a depression or in other words dish is obtained.

2—Operation B

Using vapour deposition under vacuum, a metal having good electrical conductivity, such as gold or silver (in the case of gallium arsenide) is deposited in the set of windows 12. The operation is continued until a layer 50 which covers the layer 2 is produced.

The thus treated component is ready for finishing, this possibly involving heat treatment in order to form contacts alloyed into the different depressions. In effect, the formation of a microscopic alloy at this level in no way interferes with the fulfilment of the role played by the depressions, this role being an essential one, as explained hereinafter, in improving the injected current density.

A variant embodiment of the second step of operation A consists in using, instead of photoetching, a technique of printing an electronsensitive layer with the help of an electronic masking device, this making it possible to increase the resolution and, consequently, to reduce the diameter of the windows whilst retaining excellent precision in terms of their contour. It would equally well be possible to use laser beam etching under the control of an electronic computer, the etching being performed as a function of the pattern of the windows to be formed in the photosensitive material.

In a variant embodiment of operation A, the insulator of layer 2, is replaced by a metal chosen in order to superficially dope the semiconductor material during a heat treatment, the doping producing a conductivity type which is the opposite of that of the material. In the case of gallium arsenide, the metal would for example be zinc producing p-type doping at the surface of an n-doped material, and tin, producing n-type doping at the surface of the p-doped gallium arsenide. The use to which this kind of rectifying junction could be put, is explained hereinafter.

In a variant embodiment of operation B, at the bases of the depressions, using an epitaxial technique for example, a certain quantity of semiconductor material which is more highly doped than the initial material but with the same conductivity type, is deposited. This more highly doped material can be of the same nature as the initial material, or may differ from it, for example germanium being deposited upon gallium arsenide. In the latter case, the germanium can be deposited in the bottom of the depressions, that is to say in a series of studs smaller than the depressions and formed for example by photoetching or by electronic masking.

An experimental assembly shown in FIG. 6 makes it possible to define the order of magnitude of the increase in injected current in the case of the contact manufactured by the method of the invention. A parallelpiped substrate 61 of gallium arsenide antimony-doped at a density of $10^{18}$ atoms per cubic centimeter, comprises, upon its top face a small-area contact 62, for example having an area of $0.7 \ 10^{-3}$ cm$^2$, the bottom face of which has been metallised 63 over the whole of its area. Connecting leads link the contacts 62 and 63 respectively to the —and+poles of a 1 volt battery. In a first embodiment of the assembly shown in FIG. 6, the contact 62 is a conventional one and a current of 0.35 mA is measured. In a second embodiment the contact 62 is provided over its whole area with a matrix of circular depressions 6 microns in diameter at a pitch interval of 10 microns, and the current measured is 3.5 mA. Taking into account the ratio r defined earlier, namely 0.27 in the particular case of the two arrangements discussed, the injected current density has been multiplied by around 37 times.

One possible explanation of the way in which the structure in accordance with the invention operates is as follows. We know that the "tunnel" effect plays an important part in the phenomenon of injection of electrons between metal and semiconductor. However, the structure constituted by the depressions brings about a major increase in the electric field due to the "edge" or "spike" effect, and this increase promotes the "tunnel" effect.

Experience shows that in certain conditions this increase more than compensates for the reduction in area resulting from the production of a matrix of depressions.

The local increase in the electric field and consequently the increase in the "tunnel" effect, is promoted by the existence of angular points in the profile of the depression.

The formation of a rectifying junction in the matrix intervals also promotes a local increase in the field by increasing the discontinuity between depressions and the intervals between depressions.

Figure 7:
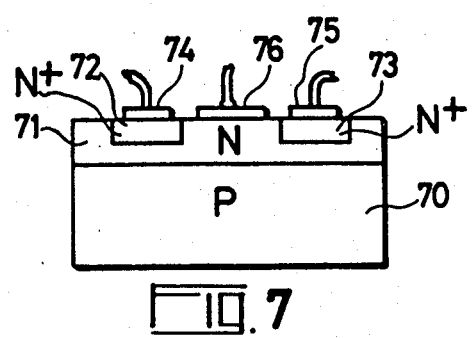
FIG. 7 illustrates an example of the application of the invention.

The invention relates in particular to the design of field-effect transistors designed to operate at very high frequencies, in which the contact resistances must be reduced to a minimum. In the example shown in FIG. 7, we are dealing with a transistor which, on a p-doped gallium arsenide substrate 70 carries an epitaxially grown layer 71 of an n-doped gallium arsenide. The two identical contacts designed to play the parts of source and drain have been formed at the surface of the layer 71 in two small areas 72 and 73 locally doped with N+ impurities. These contacts have been formed by the method of the invention. By contrast, the gate 76, which is in effect a SCHOTTKY diode, is formed by a simple metal deposit.

The increase in the injected current density resulting from the invention can advantageously be exploited in two possible ways:

(1) for an a priori dictated doping level, in particular in the case of contacts between metal and n-doped semiconductor, there can be produced extremely low contact resistances and this is an advantage in particular very high frequencies.

(2) For a lower doping level, something which may be advantageous for certain semiconductor components, contact resistances can be obtained which are just as low as if the doping level had been higher.

What we claim is:

1. A method of manufacturing "metal semiconductor" contacts destined to be employed together as a single contact, consisting of:
    (I) depositing an insulating layer onto the surface of a semiconductor;
    (II) forming in said insulating layer and in a superficial portion of said semiconductor a matrix of microscopic depressions having a major dimension d, said depressions separated by an interval e, wherein $0.1 \text{ micron} \leq d \leq 10 \text{ microns}$ $1.5 \text{ micron} \leq e \leq 30 \text{ microns}$;

(III) depositing a layer of conductive material in said depressions until a single conductive layer covering the matrix of depressions is formed; said matrix of depressions and said insulating layer being completely enshrouded by a substantially planar layer of said conductive material and the thickness thereof being substantially uniform over the entire surface area of said insulating layer and the matrix of depressions contained therein to thereby increase the injected current density and concurrently substantially eliminate contact resistances of said contacts.

2. A method as claimed in claim 1, wherein the step (II) comprises an ion machining step applied to the matrix of depressions.

3. A method as claimed in claim 1, wherein:
    step (I) comprises depositing a silica layer on said surface; and
    step (II) comprises forming windows by an etching operation in said silica layer, and excavating said windows to form depressions penetrating said semiconductor.

4. A method as claimed in claim 1, wherein the step III involves a heat treatment following deposition of the conductive material.

5. A method as claimed in claim 1, wherein the step (II) comprises an electronic masking step.

6. A method as claimed in claim 1, wherein the step (II) comprises a laser beam etching operation.

7. A method as claimed in claim 1, wherein in step (III) said conductive material is a metal layer.

8. A method as claimed in claim 8, wherein said metal, by doping of the semiconductor material, forms a rectifying junction.

9. A method as claimed in claim 1, wherein the cross sectional area of said depression decreases between the surface of the semiconductor and the base of the depression, forming the depression into a dish shape in the superficial portion of said semiconductor, whereby the shape of the depression increases the local electric field and promotes the tunnel effect.

10. A method of manufacturing "metal semiconductor" contacts destined to be employed together as a single contact, consisting of:
    (I) depositing an insulating layer of silica onto the surface of a semiconductor;
    (II) forming windows in said insulating silica layer by an etching operation and excavating said windows by an ion machining step in a superficial portion of said semiconductor to form a matrix of microscopic depressions having a major dimension d, said depressions separated by an interval e, wherein $0.1 \text{ micron} \leq d \leq 10 \text{ microns}$ $1.5 \text{ micron} \leq e \leq 30 \text{ microns}$;

(III) depositing a layer of conductive metal material in said depressions until a single conductive layer covering the matrix of depressions is formed; heat treating following the deposition; said matrix of depressions and said insulating layer being completely enshrouded by a substantially planar layer of said conductive material and the thickness thereof being substantially uniform over the entire surface area of said insulating layer and the matrix of depressions contained therein to thereby increase the injected current density and concurrently substantially eliminate contact resistances of said contacts.

* * * * *

UNITED STATES PATENT AND TRADEMARK OFFICE
CERTIFICATE OF CORRECTION

PATENT NO. : 4,307,131
DATED : Dec. 22, 1981
INVENTOR(S) : Paul C. Moutou, et. al.

It is certified that error appears in the above—identified patent and that said Letters Patent is hereby corrected as shown below:

On the title page, add Item [30] to read:

[30]---Foreign Application Priority Data

Jan. 30, 1976 [FR] France............76 02588

Signed and Sealed this

Sixth Day of April 1982

[SEAL]

Attest:

GERALD J. MOSSINGHOFF

*Attesting Officer*     *Commissioner of Patents and Trademarks*